United States Patent
Clevenger et al.

(10) Patent No.: US 6,268,293 B1
(45) Date of Patent: Jul. 31, 2001

(54) METHOD OF FORMING WIRES ON AN INTEGRATED CIRCUIT CHIP

(75) Inventors: Lawrence Clevenger, LaGrangeville; Greg Costrini; Dave Dobuzinsky, both of Hopewell Junction; Yoichi Otani, Wappingers Fall; Thomas Rupp, Stormville; Viraj Sardesai, Poughkeepsie, all of NY (US)

(73) Assignees: International Business Machines Corporation, Armonk, NY (US); Infineon Technologies North American Corporation, San Jose, CA (US)

( * ) Notice: Subject to any disclaimer, the term of this patent is extended or adjusted under 35 U.S.C. 154(b) by 0 days.

(21) Appl. No.: 09/442,956

(22) Filed: Nov. 18, 1999

(51) Int. Cl.$^7$ ....................... H01L 21/302; H01L 21/461; G01L 21/30

(52) U.S. Cl. .................... 438/706; 438/14; 438/622; 438/637; 438/700; 438/734; 438/723; 216/59; 216/80

(58) Field of Search ..................... 438/700, 711, 438/714, 710, 707, 706, 723, 726, 734, 735, 637, 667, 668, 672, 675, 622, 14; 216/59, 80, 79, 74, 58, 67

(56) References Cited

U.S. PATENT DOCUMENTS 5,770,098 * 6/1998 Araki et al. ............................ 216/67

* cited by examiner

Primary Examiner—Charles Bowers
Assistant Examiner—Thanhha Pham
(74) Attorney, Agent, or Firm—DeLio & Peterson, LLC; Peter W. Peterson; H. Daniel Schnurmann

(57) ABSTRACT

A damascene method of forming conductive lines in an integrated circuit chip. Trenches are etched by a plasma formed by capacitively coupling a gas mixture at 500 to 3000 watts under a pressure of 50–400 mTorr. The gas mixture includes 2–30 sccm of $C_4F_8$, 20–80 sccm of CO, 2–30 sccm of $O_2$ and 50–400 sccm of Ar. Gas flow can be adjusted to an optimum level, thereby achieving a high degree of uniformity. Wafers falling below a selected uniformity may be reworked. A damascene wiring layer formed in the trenches with an acceptable flow exhibit a high degree of sheet resistance uniformity and improved line to line shorts yield.

12 Claims, 5 Drawing Sheets

METHOD OF FORMING WIRES ON AN INTEGRATED CIRCUIT CHIP

BACKGROUND OF THE INVENTION

1. Field of the Invention

The present invention generally relates to semiconductor devices and, more particularly, to forming uniform metal interconnections for semiconductor integrated circuits to eliminate metal line sheet resistance variations.

2. Background Description

A semiconductor chip is an array of devices with conducting terminals that are interconnected by wiring patterns of metal strips. In Very Large Scale Integration (VLSI) chips, these metal wiring patterns are multilayered. Each wiring layer is separated from other conducting layers by insulating material layers. Interconnections between different wiring pattern layers are made through holes (vias) that are etched through the insulating material layers.

As VLSI chip features shrink and the number of wiring layers increases, surface irregularities in each layer translate to subsequent layers, making each subsequent layer's surface even more irregular. These irregularities distort shapes formed on the surface, making level to level alignment difficult. In some cases, this distortion is so severe as to make it nearly impossible to adequately replicate (print) the intended shape or to align printing masks to previous levels.

One prior art way surface irregularities were reduced was filling the vias with conducting material (i.e., form studs in the vias) before printing the wiring pattern on the insulating material surface. However, the raised wiring layer shapes on the surface still caused irregularities in subsequent surfaces. Therefore, techniques have been developed that are used at various levels to create a nearly perfectly flat, or, planar surface at each layer, so that shapes are printed with high dimensional and geometric accuracy. These techniques are known in the art as planarization techniques. One such planarization process is known as Chemical-Mechanical Polishing, also known as Chem-Mech Polishing or CMP.

A CMP application known as the Damascene process provides a planar wiring layer surface by forming trenches in the surface and forming wires in the trenches. A layer of $SiO_2$ or another suitable dielectric is planarized by CMP and wiring patterns are formed as recesses or trenches in the planar surface. Then, after a conformal metal deposition, the metal surface is chem-mech polished to selectively remove metal until metal conductor remains only in the patterned recesses of the dielectric. The metal is completely removed from the dielectric surface in non-recessed areas.

Presently, the Damascene process is used, when possible, to produce lines and vias for intra-chip wiring. The uniformity of lines formed by a damascene process depends upon the uniformity of the trenches in which the lines are formed. Unfortunately, oxide trench etching in damascene line formation is not perfectly uniform and so trench variations result across the wafer. Trench depth variation causes a wide metal sheet resistance variation across the wafer. Trench width variation also results in an overall chip yield decrease due to line to line shorts at one extreme and open lines at the other.

Thus, there is a need for a damascene process with reduced oxide trench variation, metal line sheet resistance variation and yield loss.

SUMMARY OF THE INVENTION

It is therefore a purpose of the present invention to improve integrated circuit chip yield;

It is another purpose of the present invention to reduce DRAM wiring layer sheet resistance variations;

It is yet another purpose of the present invention to improve trench uniformity of trenches formed for damascene wires on DRAM chips;

It is yet another purpose of the present invention to reduce DRAM chip yield loss from line to line shorts;

It is yet another purpose of the present invention to improve wire uniformity on DRAM chips formed using a damascene process.

The present invention is a damascene method of forming conductive lines in an integrated circuit chip. Trenches are etched by a plasma formed by capacitively coupling 500 to 3000 watts under a pressure of 50–400 mTorr, 2–30 sccm of $C_4F_8$, 20–80 sccm of CO, 2–30 sccm of $O_2$ and 50–400 sccm of Ar. The trenches exhibit a high degree of uniformity. By measuring trench uniformity, gas flow can be adjusted to an optimum level, thereby improving uniformity. Wafers falling below a selected uniformity may be reworked. Thus, the damascene wiring layer formed in the trenches with an acceptable flow exhibit a high degree of sheet resistance uniformity and improved line to line shorts yield.

BRIEF DESCRIPTION OF THE DRAWINGS

The foregoing and other objects, aspects and advantages will be better understood from the following detailed preferred embodiment description with reference to the drawings, in which.

DETAILED DESCRIPTION OF A PREFERRED EMBODIMENT OF THE INVENTION

Figure 1:
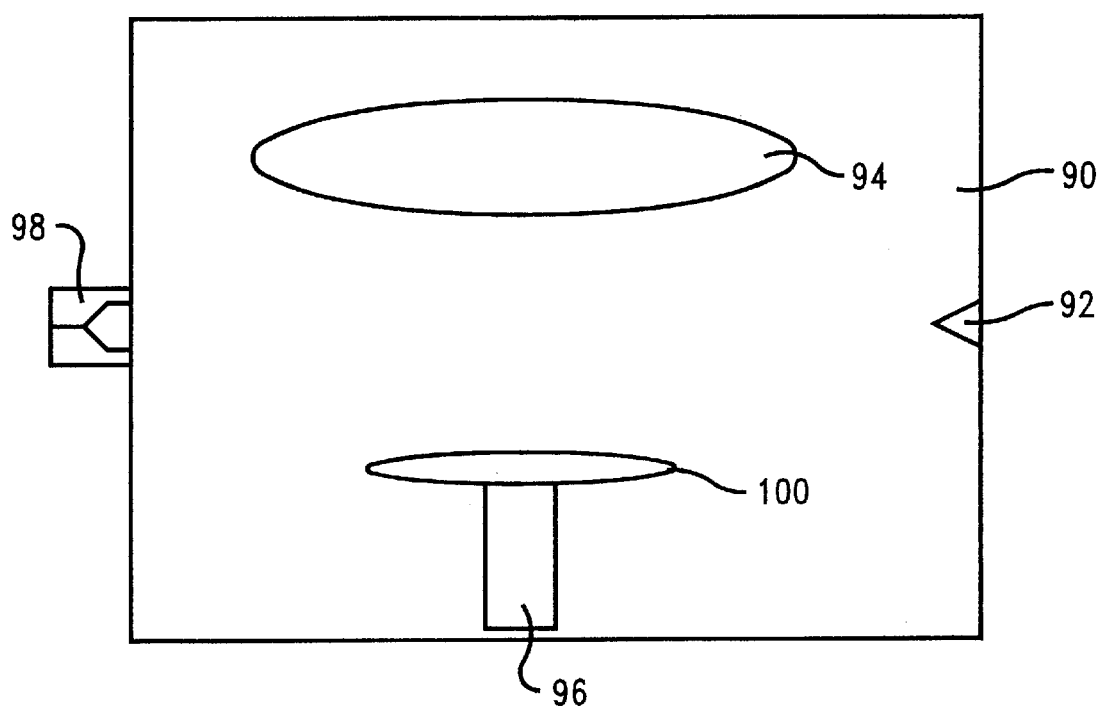
FIG. 1 shows an etching chamber for etching uniform trenches in a silicon oxide surface of a wafer according to the preferred embodiment of the invention.

Referring now to the drawings, and more particularly, FIG. 1 shows an etching chamber 90, preferably of a TEL tool, for etching uniform trenches in a silicon oxide surface of a wafer 100 according to the preferred embodiment of the invention. The chamber 90 includes an orifice 92 for introducing etchant gas, an anode 94 and a cathode 96 for forming a capacitively coupled plasma and an exhaust unit for exhausting spent plasma gas. Trenches were formed using the TEL tool to etch the surface oxide layer with a capacitively coupled 1500 watts/86 mTorr plasma in the chamber.

Figure 2A:
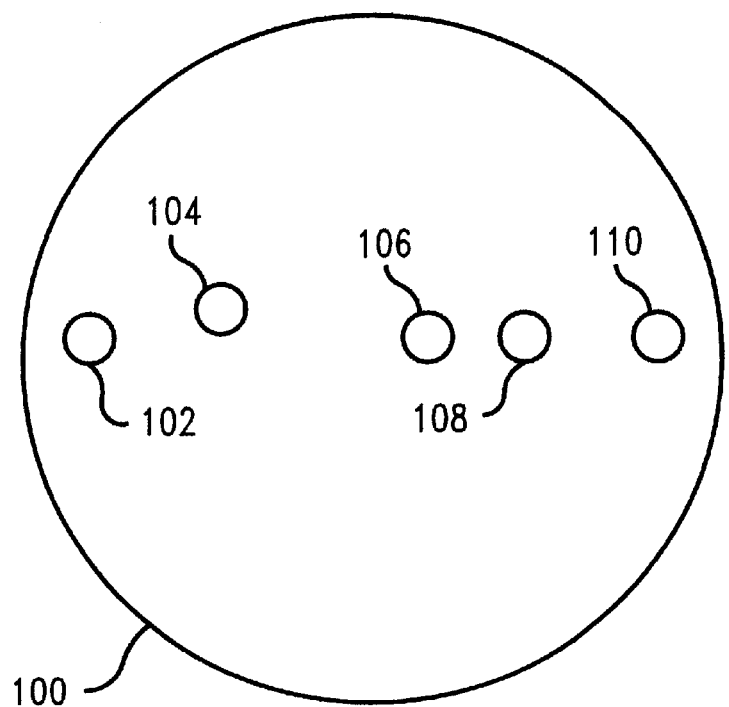
FIG. 2A represents a test site wafer wherein a state of the art damascene process and the preferred embodiment process was used to form wires in a dielectric layer.
Figure 2B:
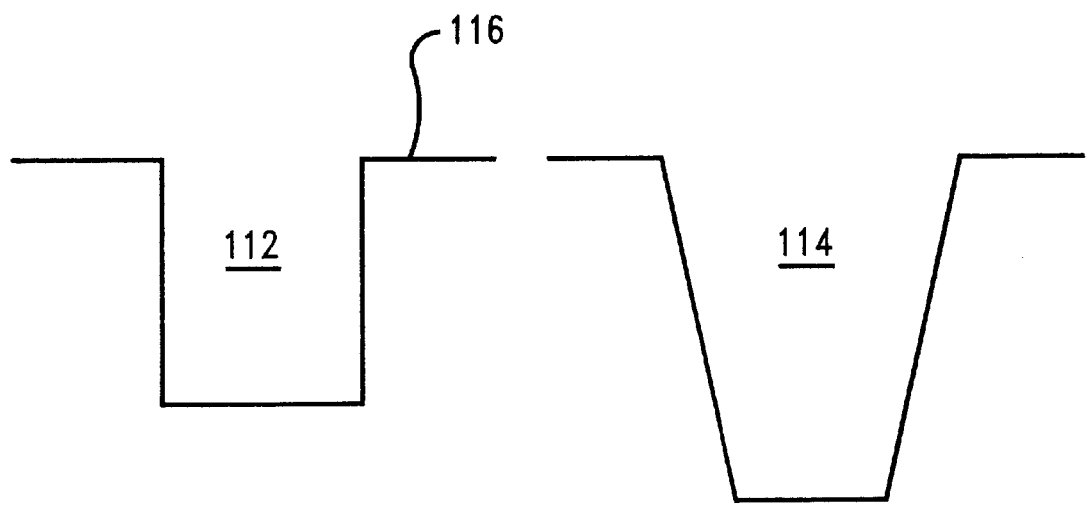
FIG. 2B shows trench cross-sections of trenches formed on the wafer of FIG. 2A.

Thus, FIG. 2A represents the test site wafer 100 wherein wires were formed in a dielectric layer using a state of the art damascene process and the preferred embodiment process in the above chamber 90. Sites 102, 104, 106, 108 and 110 represent locations where trenches were measured and are not actual measurement sites, but are shown for explanation purposes only. On various test wafers the target trench depth ranged from 200–500 nm. FIG. 2B represents trench cross-sections 112, 114 at locations 102, 106, respectively, formed using a typical state of the art oxide etch.

For this state of the art process, the total plasma gas flow mixture used was 10 standard cubic centimeters per minute (sccm) of $C_4F_8$, 50 sccm of CO, 10 sccm of $O_2$ and 200 sccm Ar. The temperature of the etch tool cathode 96 was 25° C. and of the etch chamber 90 wall was 60° C. On one typical experimental wafer, after etching the trenches using the state of the art etch, the measured trench depth at the five sites 102, 104, 106, 108 and 110 was 2646, 2474, 2228, 2350 and 2313 Å, respectively. The resulting average depth was 2365 Å, with a range of 418 Å and a standard deviation (1σ variation) of nearly three percent (3%). This 3% etch depth variation when coupled with other pertinent manufacturing variations can result in greater than 20% variation in metal line sheet resistance.

In addition to the etch depth variation, as is represented in FIG. 2B, some trenches have a resulting trapezoidal cross-section, being wider at the wafer surface than at the trench bottom. The variation of this trapezoidal cross-section, causes a line width variation at the trench tops, especially at the wafer surface 116. Chip yield is reduced as a result of this surface line-width variation, either due to metal line-line shorts at the widest trenches or from open lines at narrowest trenches. Prior attempts to reduce this variation by changing the overall etch power or the etch gas mix, reducing or increasing the percentage of one of the etch gases, have failed to improve the etch depth uniformity and line to line sorts yield.

The inventors have discovered that the key to reducing the above described wire dimensional variation is in the plasma gas flow rate. Wires formed using the preferred embodiment damascene process of the present invention exhibit an across the wafer etch uniformity such that less than 1.0% variation has been achieved. Thus, wires are formed in trenches etched with a plasma formed of a gas having a flow rate of $C_4F_8$ is 2–30 sccm and, preferably, 8 sccm; the flow rate of CO is 20–80 sccm and, preferably, 40 sccm; the flow rate of $O_2$ is 2–30 sccm and, preferably 8 sccm; and the flow rate of Ar is 50–400 and, preferably 160 sccm.

For the preferred embodiment, plasma is formed by capacitively coupling 500 to 3000 Watts, preferably 1500 Watts, to the above gas mixture of $C_4F_8$, CO, $O_2$ and Ar at the preferred flow rate under a pressure range of 50–400 mTorr, preferably 86 mTorr. Optionally, argon may be replaced with an equivalent gas. The etching tool cathode 96 is maintained at temperature range of 0–80° C., preferably 25° C., and the tool wall temperature is 10–90° C., preferably 60° C. As noted above, the etch tool 90 used to demonstrate the invention experimentally is a TEL oxide etch tool. The actual etch conditions selected to form the trenches depends upon the etch chamber used, desired trench depth in combination with the result of the etch on the wafer as set forth below.

The same pattern of FIGS. 2A–B was etched into test wafers 100 using the TEL tool capacitively coupling the plasma to 1500 Watts under 86 mTorr, but with the gas flow rates set at 8 sccm $C_4F_8$, 40 sccm CO, 8 sccm $O_2$ and 160 sccm Ar. After etching the trenches and measuring, the corresponding etch depth and uniformity measurements were 2332, 2305, 2378, 2342 and 2291 Å, respectively. Thus, for this experiment the resulting trenches exhibit substantial uniformity improvement having an average depth of 2329 Å with an improved range of 87 Å and a correspondingly much smaller 0.84% standard deviation. Trenches formed according to the preferred embodiment have exhibited a more rectangular cross-section across the wafer.

Figure 3:
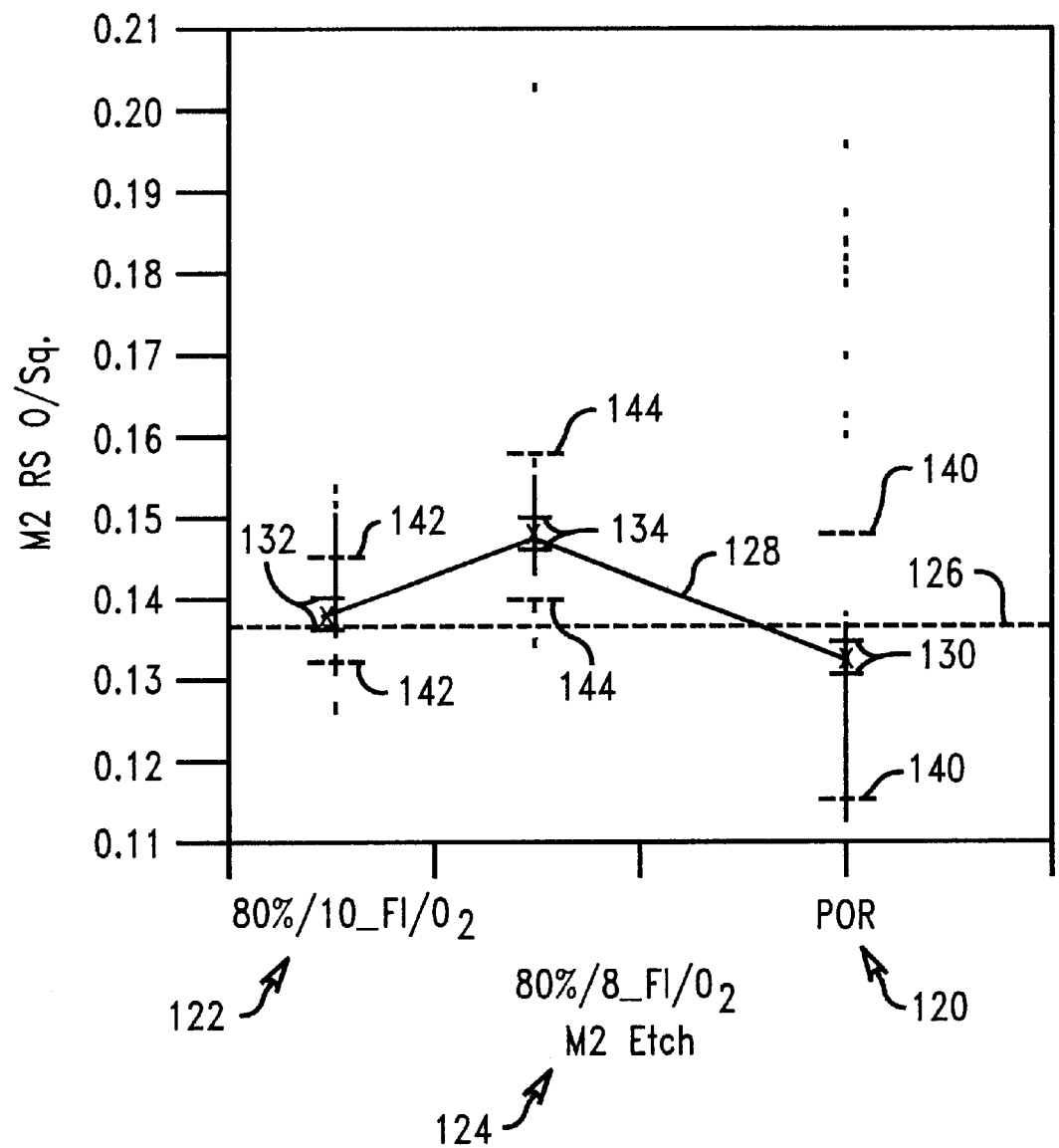
FIG. 3 is a plot showing a comparison of lines formed using the state of the art damascene process with lines formed using preferred embodiment processes.

FIG. 3 is a plot showing a comparison of lines formed above using the described state of the art damascene process with lines formed using two preferred embodiment process variations. Trenches were formed using both the state of the art process 120 and two variations 122, 124 of the preferred embodiment etch conditions and aluminum lines were formed in the trenches. So, for the state of the art process flow rate conditions 120 as described above the flow rate was 10 sccm $C_4F_8$, 50 sccm CO, 10 sccm $O_2$ and 200 sccm Ar at 1500 Watts/86 mTorr. For the two preferred embodiment variations, the flow rate for the samples at location 122 was 8 sccm $C_4F_8$, 40 sccm CO, 10 sccm $O_2$ and 160 sccm Ar at 86 mTorr and for samples at location 124 was 8 sccm $C_4F_8$, 40 sccm CO, 8 sccm $O_2$ and 160 sccm Ar at 86 mTorr. Each of the points on the plots corresponds to a measured site on five total wafers for each split. The superior results of the preferred embodiment can be seen by comparing the electrical test results.

The target sheet resistance, represented by horizontal line 126 was slightly less than 0.14 ohms pre square. The mean sheet resistance for the three sets of test wafers 120, 122, 124 are connected by line 128 for easy visual comparison. The standard deviation of the measured means is marked with horizontal pairs of lines 130, 132 and 134, respectively. The standard deviation for all of the data taken for each sample is represented by horizontal lines 140, 142 and 144, respectively. The collected sheet resistance data of FIG. 3 confirms that the trenches formed according to the preferred embodiment have a smaller mean error and a smaller sheet resistance standard deviation as a result of a lower variation in the initial oxide trench depths.

Figure 4:
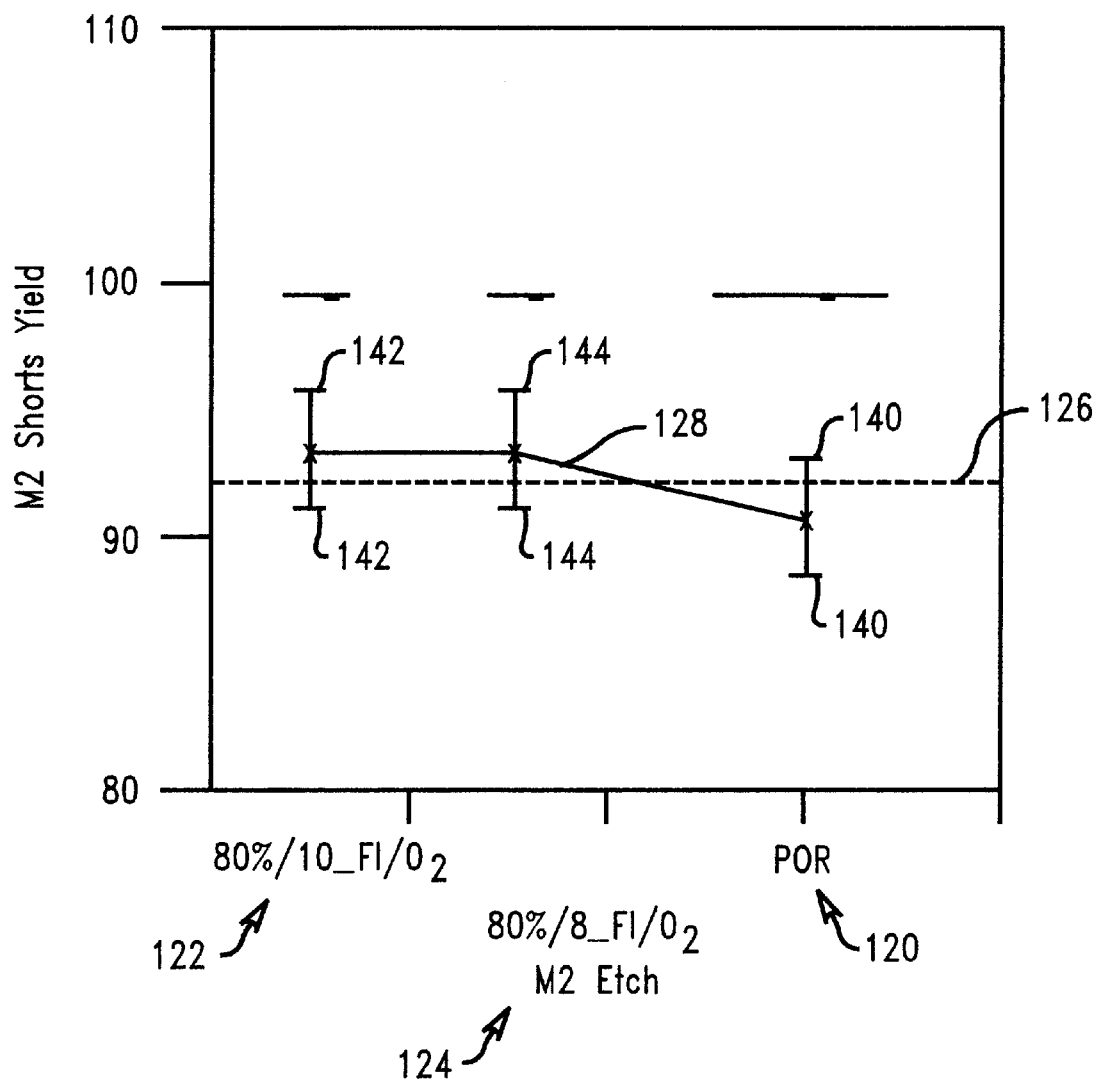
FIG. 4 is a line to line yield comparison of the wafers of FIG. 2.

FIG. 4 is a line to line yield comparison of the same wafers with lines having the same function as in FIG. 3 being labeled identically. Thus, it can be seen that the resulting reduced variation in the initial trench width also translates to improved chip yield for the preferred embodiments.

Figure 5:
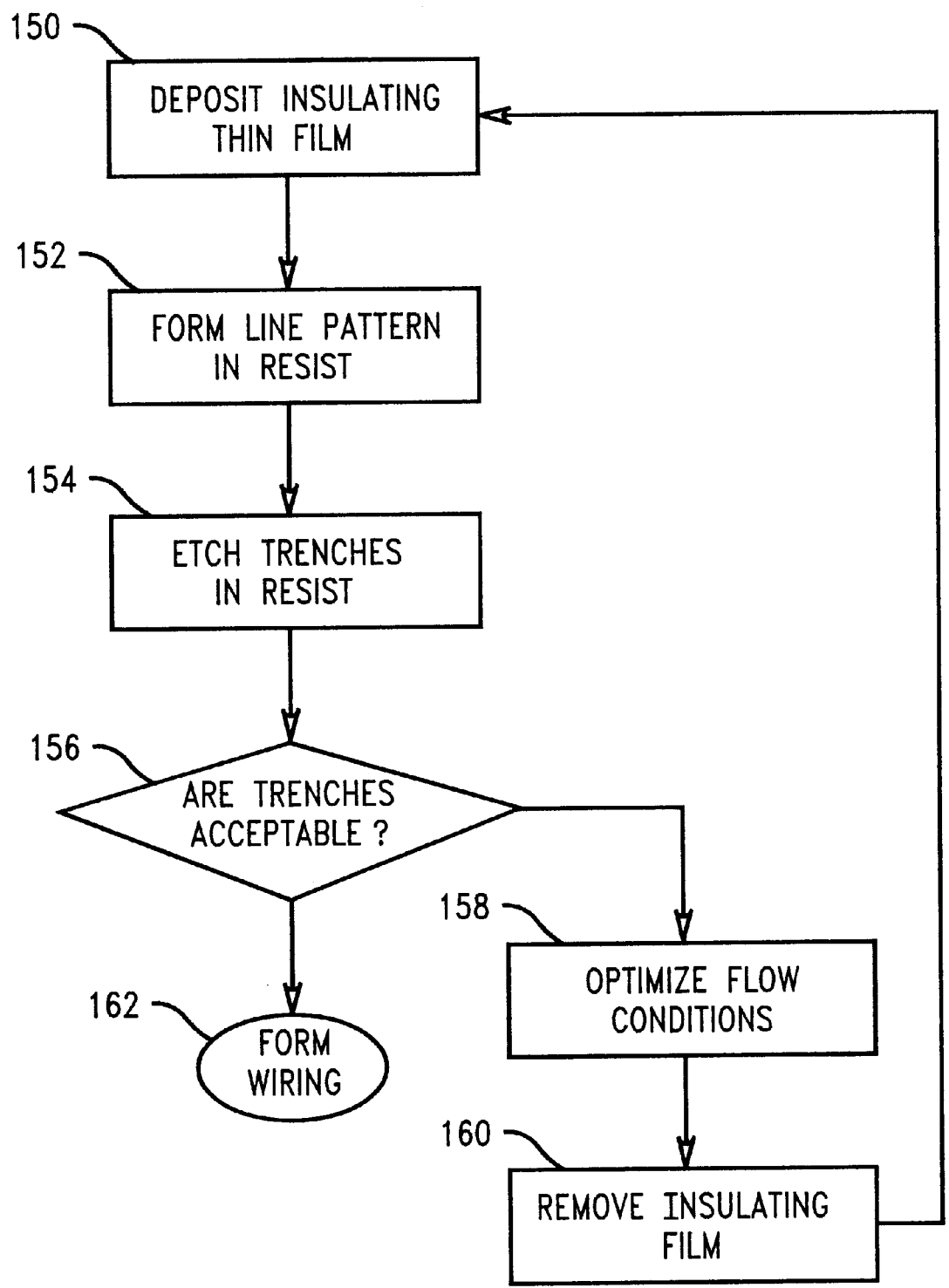
FIG. 5 is a flow diagram for forming wires with improve uniformity according to the preferred embodiment of the present invention.

FIG. 5 is a flow diagram for forming wires with improved uniformity according to the preferred embodiment of the present invention. In step 150 a thin insulating film, preferably a 200 Å to 5 $\mu$m thick oxide layer, is formed on a semiconductor wafer. Typically, the film is an oxide layer formed on a partially complete multilevel integrated circuit silicon chip. The oxide layer is deposited using sputtering, plasma enhanced chemical vapor deposition (PECVD) or a suitable oxide formation technique. Then, in step 152, a resist layer is formed on the insulating film and the trench pattern is printed in the resist layer. The resist may be patterned using an appropriate optical, e-beam, or x-ray technique. Next in step 154, using the above described preferred embodiment etch flow conditions, trenches are etched into the oxide film as defined by the resist pattern. Having formed the trenches, trench quality is measured in step 156 to verify that the critical trench width and depth variations are acceptable (<2.5%) across the wafer and, optionally, from wafer to wafer.

If in step 156 the measured variation is found unacceptable, i.e., a 1σ variation >2.5% then, in step 158, flow conditions are adjusted to achieve optimal values. Optionally, in step 160, the insulating film may be removed from the wafer and the insulating layer reformed in step 150.

Alternatively, the trench pattern may be refilled with oxide in step 160 and the resist pattern reformed in step 152. However, if it is determined in step 156 that the trench depth variation is <2.5% and so, the wafer is acceptable, then, metal lines may be formed in the trenches in step 162.

As described hereinabove, the oxide etch of the preferred embodiment damascene method is an $C_4F_8/CO/O_2/Ar$ gas combination in a capacitively coupled plasma (CCP) etch configuration. The exact etch conditions are selected to optimize the total flow of gases in the etch chamber, while still maintaining a plasma discharge. When the preferred flow conditions are achieved, trench width and depth uniformity exhibit a 1σ variation that is <2.5%.

While the invention has been described in terms of preferred embodiments, those skilled in the art will recognize that the invention can be practiced with modification within the spirit and scope of the appended claims.

What is claimed is:

1. A damascene method of forming metal lines on an integrated circuit chip, said method comprising:
   a) forming a plurality of trenches in a dielectric layer on the surface of a semiconductor wafer by flowing a mixture of gasses at a rate of 2–30 sccm of $C_4F_8$, 20–80 sccm of CO, 2–30 sccm of O2 and 50–400 sccm of Ar over the wafer surface;
   b) measuring trench uniformity across said semiconductor wafer which exceeds a maximum variation;
   c) adjusting the flow conditions of said gasses within the aforestated range of rates to optimize the rate of flow of said gasses to form said trenches within said maximum variation;
   d) re-measuring trench uniformity across said semiconductor wafer below said maximum variation; and
   e) filling said trenches with metal only when said trench uniformity is measured below said maximum variation.

2. A damascene method of forming metal lines as in claim 1, wherein said flow of gases is capacitively coupled at 1500 watts and maintained at a pressure range of 86 mTorr.

3. A damascene method of forming metal lines as in claim 2, wherein $C_4F_8$ is flowed at a rate of 8–10 sccm.

4. A damascene method of forming metal lines as in claim 3, wherein $C_4F_8$ is flowed at a rate of 8 sccm.

5. A damascene method of forming metal lines as in claim 3, wherein $C_4F_8$ is flowed at a rate of 10 sccm.

6. A damascene method of forming metal lines as in claim 2, wherein CO is flowed at a rate of 40 sccm.

7. A damascene method of forming metal lines as in claim 2, wherein $O_2$ is flowed at a rate of 8–10 sccm.

8. A damascene method of forming metal lines as in claim 7, wherein $O_2$ is flowed at a rate of 8 sccm.

9. A damascene method of forming metal lines as in claim 7, wherein $O_2$ is flowed at a rate of 10 sccm.

10. A damascene method of forming metal lines as in claim 2, wherein Ar is flowed at a rate of 160 sccm.

11. A damascene method as in claim 1 wherein in step b) there is measured width and depth uniformity of the trenches.

12. A damascene method as in claim 11 wherein in step d) width and depth uniformity of the trenches formed in said dielectric layer have a 1σ variation of less than 2.5%.

* * * * *